United States Patent [19]

Arvidson et al.

[11] Patent Number: 4,724,160

[45] Date of Patent: Feb. 9, 1988

[54] PROCESS FOR THE PRODUCTION OF SEMICONDUCTOR MATERIALS

[75] Inventors: Arvid N. Arvidson; Michael H. Greene; James R. McCormick, all of Midland, Mich.

[73] Assignee: Dow Corning Corporation, Midland, Mich.

[21] Appl. No.: 889,666

[22] Filed: Jul. 28, 1986

[51] Int. Cl.$^4$ ............................................. B05D 3/14
[52] U.S. Cl. .................................... 437/225; 118/724; 118/725; 427/52; 427/248.1; 427/255; 427/51

[58] Field of Search ..................... 427/51, 52, 86, 87, 427/248.1, 255; 118/724, 725

[56] References Cited

U.S. PATENT DOCUMENTS

| | | | |
|---|---|---|---|
| 3,011,877 | 12/1961 | Schweickert et al. | 422/129 |
| 3,099,534 | 7/1963 | Schweickert et al. | 423/346 |
| 3,147,141 | 9/1964 | Ishizuka | 118/49.1 |
| 4,147,814 | 4/1979 | Yatsurugi et al. | 427/51 |
| 4,150,168 | 4/1979 | Yatsurugi et al. | 427/51 |
| 4,179,530 | 12/1979 | Koppl et al. | 427/51 |
| 4,215,154 | 7/1980 | Behensky et al. | 427/51 |
| 4,311,545 | 1/1982 | Bugl et al. | 156/613 |
| 4,481,232 | 11/1984 | Olson | 427/52 |
| 4,539,933 | 9/1985 | Campbell et al. | 118/725 |
| 4,620,984 | 11/1986 | Hoddinott | 118/724 |

Primary Examiner—Sadie L. Childs
Attorney, Agent, or Firm—Carl A. Yorimoto

[57] ABSTRACT

An improvement in a process for the production of semiconductor materials from the vapor decomposition of a precursor compound of the desired semiconductor material and the deposition of the desired semiconductor material. The improvement comprises the heating of the exterior surface of a metallic enclosure of a reactor to facilitate preheating thin rods of the semiconductor material, the rods supplying the heat for decomposition and acting as a substrate for deposition, to a temperature of about 250° C. to render the thin rods conductive enough to effectively pass an electric current.

13 Claims, 1 Drawing Figure

PROCESS FOR THE PRODUCTION OF SEMICONDUCTOR MATERIALS

BACKGROUND OF THE INVENTION

This invention relates to an improvement in the process for the production of semiconductor materials by the vapor decomposition of a precursor compound of the semiconductor material and deposition of the desired semiconductor material. More specifically, this invention relates to an improved method of preheating the decomposition/deposition reactor.

High-purity semiconductor materials are a critical raw material in the electronics industry. The production of semiconductor materials, particularly silicon, via the decomposition of a gaseous precursor compound of a desired semiconductor material and deposition of the semiconductor material on a suitable substrate is a well-known, widely used process. The combined decomposition/deposition process comprises: (1) an electrically heated rod covered by an enclosure to allow operation under vacuum or pressure conditions; (2) a means for feeding a precursor compound of the desired semiconductor material and other reactant gases, as necessary, into the closed zone formed by the base member and the enclosure; (3) electrically heating the rod to a temperature sufficient to effect decomposition of the precursor compound of the desired semiconductor material and simultaneous deposition of the semiconductor material on the rod; and (4) handling any by-product gases and unreacted vapors of the precursor compound of the semiconductor material and other reactant gases. Representative examples of the apparatus and method described above are disclosed in several U.S. Pat. Nos.: 3,011,877, Schweickert et al., issued Dec. 5, 1961; 3,099,534, Schweickert et al., issued July 30, 1963; 3,147,141, Ishizuka, issued Sept. 1, 1964; 4,150,168, Yatsurugi et al., issued Apr. 17, 1979; 4,179,530, Koppl et al., issued Dec. 18, 1979; and 4,311,545, Bugl et al., issued Jan. 19, 1982.

One of the improvements that has been incorporated into the above-described process is the use of the desired semiconductor material as the material from which the electrically heated rods were fabricated. However, the nature of the semiconductor material renders the rods very poor conductors of electricity at ambient temperatures. To facilitate passage of electricity through the rods of the desired semiconductor material, the rods must be preheated to temperatures as high as 600° C. In earlier designs of the above-described process the enclosure was fabricated out of quartz. The transparency or translucency of quartz allowed the use of external electrical resistance heaters to preheat the reaction zone and the semiconductor rods via radiant heat.

A further improvement in the above-described process was the fabrication of the enclosure from metallic materials of construction. Suitable materials of construction were found to satisfy the very stringent purity needs in the reaction zone. The use of metallic enclosures allowed construction of larger and larger decomposition/deposition reactors. These factors combined to complicate the means for preheating the rods of the desired semiconductor material to facilitate passage of electric current. Heating with external resistance heaters via radiant heat is not possible because of the metallic construction of the enclosure. Internal heaters to effect the preheating of the semiconductor rods requires complicated mechanical design and difficulty in selecting suitable materials that would not cause contamination and that would withstand the high temperatures and corrosive environment during the decomposition/deposition reaction.

Ishizuka in U.S. Pat. No. 3,147,141, issued Sept. 1, 1964, discloses a process for the manufacture of high-purity silicon by the decomposition of silane. Ishizuka discloses a metal reactor in which a conductive wire bridge is used as the heated surface in which silane is decomposed and silicon is deposited. The use of a conductive wire precludes the need for provisions to preheat the reaction zone and rod substrate to facilitate passage of an electrical current.

Yatsurugi et al., in U.S. Pat. No. 4,150,168, issued Apr. 17, 1979, disclose a method for producing high-purity silicon from the decomposition of silane. Yatsurugi et al., disclose the use of rods of semiconductor silicon as a heat source and substrate for the decomposition of silane and the deposition of silicon. Yatsurugi et al., disclose the use of an "air blast" passing through the reactor enclosure to facilitate heating the silicon rods to allow electrical current to pass and to heat the rods to an eventual reaction temperature of more that 800° C. External cooling of the base member with water is disclosed. No means of externally preheating the reactor enclosure and the rods of semiconductor silicon is disclosed.

Koppl et al., in U.S. Pat. No. 4,179,530, issued Dec. 18, 1979, disclose the deposition of pure semiconductor materials, especially silicon, by thermal decomposition of gaseous compounds of the semiconductor material on heated carrier bodies of the semiconductor material. Koppl et al., disclose the use of an enclosure constructed of silver or silver-plated steel. Provisions are made for cooling of the enclosure with water. Koppl et al., state that the metallic enclosure of their invention is not permeable to heat radiation and heating of the carrier rod (semiconductor substrate) is accomplished by introduction of a heating finger into the reaction space. Koppl et al., further state that the ignition temperature (the temperature at which the carrier rods become conductive enough to be electrically heated to the decomposition temperature) is about 600° C. for silicon. The heating finger disclosed by Koppl et al., is an electric heating coil enclosed in a quartz cylinder. To preheat the reaction space, the heating finger is lowered into the reaction space in the proximity of the carrier rods. Once the carrier rods are at the ignition temperature and electrical current can be passed through the carrier rods, the heating finger is removed from the reactor, and the opening in the metallic enclosure is sealed with a metal cover.

In the instant invention it was unexpectedly found that silicon thin rods could pass electrical current sufficient to heat the rods to decomposition temperature when the rods were preheated to approximately 250° C. This lower preheating temperature, lower than taught in the art, facilitates more conventional means of heat transfer external to the reaction space. The ability to preheat the reactor externally eliminates the design and construction of complex, specialized pieces of equipment. Further, the use of external heating simplifies operation by eliminating the need to handle the internal heater. Further, in the case of a removable internal heater or the use of a flow of heated gas ("air blast" disclosed by Yatsurugi et al., supra,) introducing impurities during these operations would be a very possible occurrence. The unexpected finding that the reaction space need only be preheated to approximately 250° C. facilitates the use of conventional heat transfer fluids rather than direct electric heating.

The primary objective of the instant invention is to provide an improved means for preheating the reactors for the chemical vapor decomposition of a precursor compound of a semiconductor material and deposition of the semiconductor material on an electrically heated rod of the semiconductor material. Another objective of the instant invention is the simplification of the reactor configuration of large metal decomposition/deposition reactors. A further objective is to reduce the possibilities of introducing impurities into the reactor space by minimizing the opening and closing of the enclosure and eliminating the introduction of extraneous materials, such as a gas for preheating the substrate rods.

BRIEF DESCRIPTION OF THE DRAWING

The instant invention will become better understood by those skilled in the art from a consideration of the attached drawing.

FIG. 1 outlines a known decomposition/deposition reactor scheme and the inventive preheating scheme. The decomposition/deposition reactor is shown as a cross-section through the center of the reactor. The invention is set apart in FIG. 1 by the broken line enclosure. The presentation of this one embodiment of the instant invention is for illustrative purposes and is not to be construed as limiting the instant invention as delineated in the claims.

DESCRIPTION OF THE DRAWING

Figure 1:
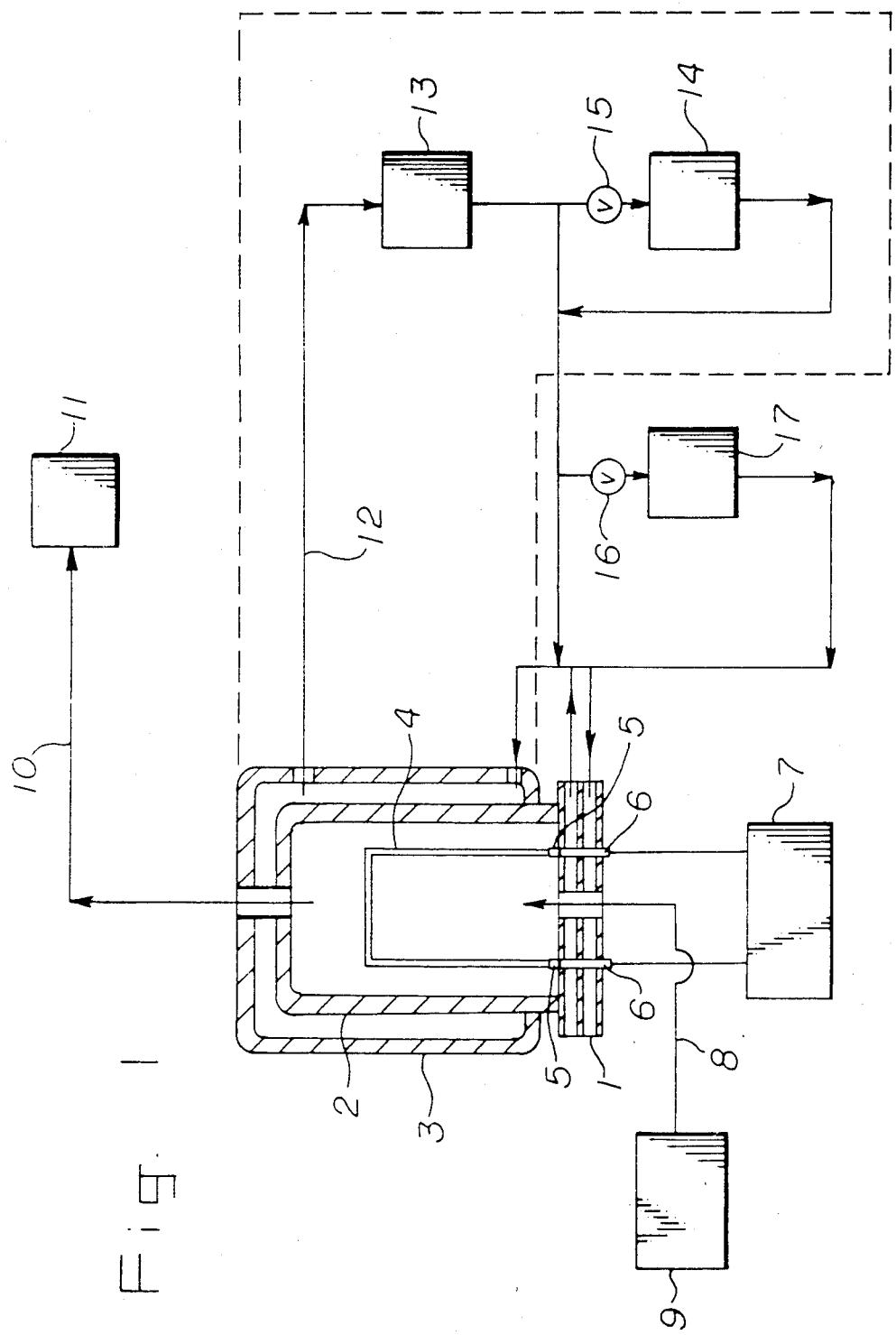
FIG. 1 is a schematic representation of one embodiment of the instant invention.

In FIG. 1, 1 is a representation of the reactor baseplate. The baseplate 1 has cavities to facilitate passage of a heat transfer liquid. A metal bell-shaped enclosure is represented by 2. The exterior surface of the bell-shaped enclosure 2 is surrounded by an enclosed channel, which in this embodiment is a jacket 3, to facilitate passage of a heat transfer liquid over the outside surface of the bell-shaped enclosure 2. The enclosed channel surrounding the exterior surface of the bell-shaped cover 2 may also be a half-pipe coil which is formed by welding a pipe half around the exterior surface. Thin rods 4 of the desired semiconductor are disposed in a U-shaped configuration and are held in place on the baseplate 1 by electrodes 5. The electrodes 5 are coupled to electrical connectors 6 which pass through the baseplate 1 and are tied to an electric power source 7. The bell-shaped enclosure 2 is placed upon the baseplate 1 and is sealed for leak-proof, pressure operation. The sealing of the bell-shaped enclosure 2 to the baseplate 1 is accomplished by such conventional means as use of a gasketed flange on the open end of the bell-shaped enclosure 2 and conventional means for holding the flanged bell-shaped enclosure to the baseplate 1. A stream 8 of vapors of a precursor compound of the desired semiconductor material, and other reactants as necessary, is fed through an opening in baseplate 1. Stream 8 is fed by a means 9 for feeding a compound of the desired semiconductor material, and other reactant gases. The gaseous precursor compound of the semiconductor material contacts the heated thin rods 4 and decomposes; the desired semiconductor material is then deposited on the surface of the heated thin rods. Gaseous by-products of the decomposition reaction and excess reactants exit as a combined gas stream 10 through an appropriate opening in the top of the bell-shaped enclosure. The combined gas stream 10 is passed to a means 11 for handling the by-product gases and excess reactants.

In this embodiment of the instant invention a hot heat transfer liquid stream 12 is circulated through the jacket 3 of the bell-shaped enclosure 2 to facilitate preheating of the thin rods 4 to a temperature of approximately 250° C. The heat transfer liquid stream 12 is circulated in a flow loop that encompasses the jacket 3 of the bell-shaped enclosure and a means 14 for heating the heat transfer liquid stream 12. The heat transfer liquid stream 12 is circulated by a means 13 for circulating hot heat transfer liquids. The heat transfer liquid should be a material with heat stability and performance characteristics that are compatible with temperatures of approximately 300° C. An example of such a heat transfer fluid would be a low-viscosity trimethylsilyl-endblocked polydimethylsiloxane fluid. The means 13 for circulating the heat transfer liquid can be a conventional means such as a recirculating pump loop that is designed to operate at temperatures of approximately 300° C. The means 14 for heating the heat transfer liquid can be a conventional means such as an electric heater or a gas-fired heater.

Once the thin rods 4 of the desired semiconductor material are preheated and brought to decomposition temperature (in excess of 700° C.), the feed stream 8 of a precursor compound of the desired semiconductor material, and other reactants as necessary, are fed. The electrically-heated thin rods 4 transfer heat to the surroundings by radiation and convective heat transfer, and cooling is required to protect the structural integrity of the metallic components of the system. The temperatures of the baseplate 1 and the bell-shaped enclosure 2 should be kept below approximately 300° C. The same flow loop for circulating the hot heat transfer stream 12 could also be used to cool the components of the system. FIG. 1 outlines this cooling scheme in this embodiment of the instant invention. Appropriate valving, valves 15 and 16, is provided so that the flow of the heat transfer liquid stream 12 is passed through means 17 for cooling a heat transfer liquid. The flow of the heat transfer liquid stream 12 would pass through both the cavities in the baseplate 1 and the jacket 3 of the bell-shaped enclosure 2. The means 17 for cooling the heat transfer liquid stream 12 can be any conventional means for cooling a hot liquid, such as a steam generator in which the heat of the hot heat transfer liquid is removed by converting liquid water to steam.

DESCRIPTION OF THE INVENTION

In accordance with the instant invention there is provided an improvement to a process for the preparation of a semiconductor material under conditions that will be delineated herein. What is described, therefore, is an improvement in a process for the deposition of a pure semiconductor material by the thermal decomposition of a gaseous precursor compound of the semiconductor material onto thin rods of the semiconductor material heated to the decomposition temperature of the precursor compound of the semiconductor material by passage of an electrical current, the process comprising A. connecting thin rods of an already formed semiconductor material to an electrical power source;

B. covering the thins rods and the baseplate with a metallic enclosure;

C. sealing the metallic enclosure to the baseplate to form a reactant-containing zone around the thin rods;

D. preheating the reactant-containing zone to a temperature at which the thin rods become conductive enough to effectively pass an electrical current;

E. feeding a gaseous precursor compound of the desired semiconductor material into the reactant-containing zone;

F. forming and depositing the desired semiconductor material on the thin rods; and G. handling gaseous by-products and unreacted compound from the reactant-containing zone, the improvement comprising:

H. heating the exterior surface of the metallic enclosure with a heat transfer fluid thereby preheating the reactant-containing zone and the thin rods to a temperature of about 250° C. at which temperature the thin rods become conductive enough to effectively pass an electric current.

The process for producing semiconductor materials as described in steps A. through G. above is similar to those processes described in the art, supra.

The use of a metallic enclosure is known in the art. However, the use of a heat transfer fluid to heat the exterior surface of the metallic enclosure to preheat the thin rods of the semiconductor material to a temperature at which the thin rods become conductive enough to pass an electric current is presented herein as being novel. It was found in the development of the instant invention that heating thin rods of a semiconductor material to temperatures of about 250° C. was sufficient to facilitate passage of an electric current through the thin rods.

The heat transfer fluid may be a gas or a liquid. Gases may be utilized as a heat transfer fluid. However, gases are less desirable than liquids as a heat transfer fluid because of the poorer heat transfer qualities of gases. Heat transfer in preheating is much less efficient with a gas as the heat transfer fluid. Condensing steam can be utilized as a heat transfer fluid. However, to reach the higher temperatures required to preheat the thin rods of the semiconductor material, the steam would have to be at an elevated pressure—i.e., to achieve a temperature of 250° C. the steam would have to be at a pressure of approximately 600 pounds per square inch absolute(psia).

Liquids that can be used as the heat transfer fluid can be water, organic liquids, polyorganosiloxane fluids, fused salts, or mixtures thereof. Water can be used as a heat transfer liquid. However, high pressure would be needed to maintain water as a liquid at the temperatures required to preheat the thin rods of the semiconductor material, as noted in the discussion on steam supra. Organic liquids and mixtures of water and organic liquids suitable for this invention are materials whose vapor pressure at the temperatures needed to preheat the thin rods of semiconductor material would not be excessive, e.g., in excess of 100 psia Additionally, the organic liquid or mixtures of water and an organic liquid should be thermally stable at the preheat temperatures. The fluids utilized as a heat transfer fluid should also be low in toxicity and pose a relatively low flammability hazard. An example of a suitable fluid that meets the criteria discussed, supra, is a polyorganosiloxane fluid. An example of a commercially available polyorganosiloxane fluid is Dow Corning Syltherm ® 800 Heat Transfer Liquid. Syltherm ® 800 Heat Transfer Liquid is a trimethylsilyl-endblocked polydimethylsiloxane fluid with heat stability additives. Typical properties of Dow Corning Syltherm ® 800 Heat Transfer Liquid (as supplied) are:

Viscosity @25° C. . . . 9.1 centipoise
Flash point, closed cup . . . 320° F.
Vapor pressure at 250° C. . . . 34 psia The means for heating the exterior surface of the metallic enclosure comprises:

(i) forming an enclosed channel around the exterior surface of the metallic enclosure;

(ii) providing a heat transfer fluid which flows in the enclosed channel around the exterior surface of the metallic enclosure;

(iii) providing a means for heating the heat transfer fluid; and (iv) providing a means for conveying the heat transfer fluid between the enclosed channel around the exterior surface of the metallic enclosure and the means for heating the heat transfer liquid.

The enclosed channel around the exterior surface of the metallic enclosure can be a jacket, a half-pipe coil welded to the exterior surface of the metallic enclosure, or the like, constructed around the exterior surface of the metallic enclosure. A jacket or half-pipe coil are known features in the art of design of reactors in which external heat transfer is required. The heat transfer fluid has been discussed, supra. The means for heating the heat transfer fluid can be any conventional means such as electric or gas-fired heaters. The means for conveying the heat transfer fluid between the jacket or the half-pipe coil around the exterior of the metallic enclosure and the means for heating the heat transfer fluid is any conventional means such as a liquid flow loop in which a liquid is circulated by a pump. Steam can be circulated by means of the pressure of a steam boiler; the resultant liquid water condensate being handled by conventional means such as pumping. Gases used as the heat transfer fluid can be circulated by such conventional means as a blower or like devices known in the art.

The semiconductor material can be such materials as silicon and the like.

PREFERRED EMBODIMENT OF THE INVENTION

The preferred mode of carrying out the instant invention is to heat the exterior surface of a metallic enclosure to a temperature of about 250° C. to effect preheating thin rods of a semiconductor material to a temperature at which the semiconductor material becomes conductive enough to pass an electric current.

The preferred means for heating the exterior surface of the metallic enclosure is the circulation of a heated fluid through a jacket or a half-pipe coil around the exterior of the metallic enclosure.

The heat transfer fluid should be a liquid. Preferably the heat transfer liquid should be a polyorganosiloxane fluid. More preferably, the heat transfer liquid should be a trimethylsilylend-blocked polydimethylsiloxane fluid.

The semiconductor can be silicon.

The following example is presented to be illustrative of the instant invention and is not to be construed as limiting the instant invention as delineated in the claims.

Example

A decomposition/deposition reactor for the preparation of semiconductor silicon, silimar to those known in the art and similar to the system illustrated in FIG. 1, supra, is assembled. Thin rods of semiconductor silicon are secured through the baseplate by means for connecting the thin rods to an electric power source. The metallic enclosure is positioned over the thin rods and secured to the baseplate to allow operation of the reactant-containing zone formed by the baseplate and the metallic enclosure to operate at pressure above atmospheric pressure. The reactant-containing zone is purged with nitrogen gas to exclude oxygen. The reactant-containing zone is then purged with hydrogen gas to displace the nitrogen gas.

The exterior surface of the metallic enclosure is fitted with a metallic half-pipe coil, wound around and welded to the exterior surface to facilitate the flow of and contact with a heat transfer liquid. The heat transfer fluid is Syltherm® 800 Heat Transfer Liquid, produced by Dow Corning Corporation. This fluid is a trimethylsilyl end-blocked polydimethylsiloxane fluid with heat additives, as described supra. The half-pipe coil is a part of both a heating loop and a cooling loop. The heating loop consists of a liquid flow loop in which an electric heater is used to heat the Syltherm® 800. The liquid flow to the heating loop is maintained at a flow rate of 20,000 pounds/hour. The cooling loop consists of the liquid flow to the half-pipe coil that is wound around the exterior of the metallic enclosure, 20,000 pounds/hour, plus a flow of 5,000 pounds/hour to cool the baseplate. The Syltherme® 800 is cooled by passing the hot fluid through a steam boiler in which water is vaporized to steam in absorbing the heat of the hot heat transfer fluid. The liquid flow loop is valved so that the heat transfer fluid flow can be passed either through the electric heater or the steam boiler.

In preheating the reactant-containing zone and the semiconductor silicon thin rods, hot heat transfer fluid is passed through the half-pipe coil for approximately 1 to 2 hours until the temperature in the reaction zone is at 240° C. The pressure in the reactant-containing zone is maintained at 50 pounds per square inch, gauge. Once a temperature of 240° C. has been attained, approximately 12 volts of electricity per inch of length of the rod of semiconductor silicon is applied to the thin rods. This voltage is applied until a power level to the thin rods of 115 to 150 watts/inch is reached. The voltage is then reduced to approximately 8 volts of electricity per inch of length of the rod of semiconductor, and the power is maintained at 150 watts/inch to heat the rods to a temperature of approximately 900° C. During this time the heat transfer fluid flow loop valving is changed to allow passage of the heat transfer fluid to pass through the steam boiler to control the wall interior wall temperature of the metallic enclosure at approximately 300° C.

The above procedure demonstrates the preheating of the reactant-containing zone and the thin rods of semiconductor silicon of a decomposition/deposition reactor via the heating of the exterior surface of a metallic enclosure with a hot heat transfer fluid. This procedure further demonstrates that a temperature of about 250° C. is adequate to allow electric current to flow in the thin rods of a semiconductor material to facilitate heating of the thin rods with electric power to the necessary temperature of 900° C. or more at which temperature the decomposition/deposition reaction may take place.

That which is claimed is:

1. In a process for the deposition of a pure semiconductor material by the thermal decomposition of a gaseous precursor compound of the semiconductor material onto thin rods of the semiconductor material heated to the decomposition temperature of the precursor compound of the semiconductor material by passage of an electrical current, the process comprising
   A. connecting thin rods of an already formed semiconductor material to an electrical power source;
   B. covering a thin rod and the baseplate with a metallic enclosure;
   C. sealing the metallic enclosure to the baseplate to form a reactant-containing zone around the thin rods;
   D. preheating the reactant-containing zone to a temperature at which the thin rods become conductive enough to effectively pass an electrical current;
   E. feeding a gaseous precursor compound of the desired semiconductor material into the reactant-containing zone;
   F. forming and depositing the desired semiconductor material on the thin rods; and
   G. handling gaseous by-products and unreacted compound from the reactant-containing zone,
   the improvement comprising:
   H. heating the exterior surface of the metallic enclosure with a heat transfer fluid thereby preheating the reactant-containing zone to effect heating the thin rods to a temperature of about 250° C. at which temperature the thin rods become conductive enough to effectively pass an electric current.

2. The process according to claim 1, wherein in step H heating the exterior surface of the metallic enclosure comprises:
   (i) forming an enclosed channel around the exterior surface of the metallic enclosure;
   (ii) providing a heat transfer fluid which flows in the enclosed channel;
   (iii) providing a means for heating the heat transfer fluid; and
   (iv) providing a means for conveying the heat transfer fluid between the enclosed channel and the means for heating the heat transfer fluid.

3. A process according to claim 2, wherein the enclosed channel is a jacket.

4. A process according to claim 2, wherein the enclosed channel is a half-pipe coil.

5. A process according to claim 2, wherein the heat transfer fluid is a gas.

6. A process according to claim 2, wherein the heat transfer fluid is a fused salt.

7. A process according to claim 2, wherein the heat transfer fluid is a liquid.

8. A process according to claim 7, wherein the liquid is an organic fluid.

9. A process according to claim 7, wherein the liquid is a polyorganosiloxane fluid.

10. A process according to claim 9, wherein the polyorganosiloxane fluid is a polydimethylsiloxane fluid.

11. A process according to claim 10, wherein the polydimethylsiloxane fluid is a trimethylsilyl end-blocked polydimethylsiloxane fluid.

12. A process according to claim 1, wherein the semiconductor material is silicon.

13. A process according to claim 11, wherein the semiconductor material is silicon.

* * * * *